United States Patent
Hsieh et al.

(10) Patent No.: US 7,183,150 B2
(45) Date of Patent: *Feb. 27, 2007

(54) RESIST PROTECT OXIDE STRUCTURE OF SUB-MICRON SALICIDE PROCESS

(75) Inventors: Ming-Chang Hsieh, Hsinchu (TW); Hsun-Chih Tsao, Hsin Chu (TW); Hung-Chih Tsai, Kaohsiung (TW); Pin-Shyne Chin, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 125 days.

This patent is subject to a terminal disclaimer.

(21) Appl. No.: 10/946,406

(22) Filed: Sep. 21, 2004

(65) Prior Publication Data

US 2005/0037623 A1    Feb. 17, 2005

Related U.S. Application Data

(63) Continuation of application No. 10/243,414, filed on Sep. 13, 2002, now Pat. No. 6,815,274.

(51) Int. Cl.
*H01L 21/338* (2006.01)
*H01L 21/336* (2006.01)
*H01L 21/31* (2006.01)

(52) U.S. Cl. .................. 438/180; 438/300; 438/763; 438/950; 257/E29.309

(58) Field of Classification Search ............... 438/180, 438/300, 763, 950; 257/E29.309
See application file for complete search history.

(56) References Cited

U.S. PATENT DOCUMENTS

| | | | |
|---|---|---|---|
| 6,015,730 A | 1/2000 | Wang et al. | |
| 6,037,222 A | 3/2000 | Huang et al. | |
| 6,130,168 A | 10/2000 | Chu et al. | |
| 6,319,784 B1 | 11/2001 | Yu et al. | |
| 6,348,389 B1 | 2/2002 | Chou et al. | |
| 6,656,811 B2 * | 12/2003 | Swanson et al. | ............ 438/320 |
| 6,815,274 B1 | 11/2004 | Hsieh et al. | |
| 2002/0011624 A1 * | 1/2002 | Ishige | ........................ 257/316 |
| 2002/0132430 A1 | 9/2002 | Willer et al. | |

* cited by examiner

*Primary Examiner*—William M. Brewster

(57) ABSTRACT

In accordance with the objectives of the invention a new method is provided for the creation of a layer of a Resistance Protective Oxide (RPO) layer. A layer of ONO is deposited that is to function as the layer of RPO. The deposited layer of ONO is patterned and wet etched, removing the upper or first layer of silicon dioxide. The patterned and etch upper of first layer of silicon dioxide is used as a hardmask to remove the central layer of silicon nitride applying a wet etch. A wet etch is then applied to remove the remaining lower of second layer of silicon dioxide, completing the patterning of the layer of RPO.

21 Claims, 3 Drawing Sheets

RESIST PROTECT OXIDE STRUCTURE OF SUB-MICRON SALICIDE PROCESS

CROSS REFERENCE TO RELATED APPLICATION

This is a continuation of U.S. Non-Provisional patent application Ser. No. 10/243,414 filed Sep. 13, 2002, by Hsieh et al., now U.S. Pat. No. 6,815,274 titled "Novel Resist Protect Oxide Structure of Sub-Micron Salicide Process," the entirety of which application is incorporated herein by reference.

BACKGROUND OF THE INVENTION (1) Field of the Invention

The invention relates to the fabrication of integrated circuit devices, and more particularly, to a method for creating a Resist Protect Oxide (RPO) structure while avoiding conventional problems of having to apply a time-consuming wet oxide etch, which typically leads to the occurrence of oxide voids and to the occurrence of metal residue inside the oxide voids.

(2) Description of the Prior Art

Improvements in the performance of semiconductor devices are achieved by continuing reductions in semiconductor devices and device feature dimensions. A major class of semiconductor devices comprises CMOS devices, the creation of CMOS devices is well known in the art. The continued miniaturization of devices and device features leads to a continued reduction in the thickness of the various layers of semiconductor material that are used for the creation of semiconductor devices.

During the formation of CMOS devices over the surface of a substrate, devices of different polarities, such as PMOS and NMOS devices, can be created overlying the surface of one substrate and as part of a continuing processing stream. Also, some of these different devices may be processed following a different processing stream. For instance, some of the CMOS devices may by provided with salicided, low resistivity points of contact to the gate electrodes of the CMOS devices. Other CMOS devices that are also created over the surface of the same substrate are not provided with salicided points of electrical contact to the CMOS devices. For this reason, that is the difference in processing steps for the creation of different CMOS devices over the surface of one substrate, some of these devices arc coated with a layer of Resistance Protective Oxide (RPO).

As an example of the difference in processing of CMOS devices that are created over the surface of one substrate can be cited the creation of self-aligned contact points to the source/drain regions and the gate electrode of a CMOS device. By universally covering all CMOS devices that are created over the surface of the substrate with a layer of RPO after the gate structures, including the gate spacers, have been created, the devices can be divided into devices that need to be provided with salicided points of electrical contact and those that do not. By then covering the devices that do not need to be provided with salicided points of contact with a patterned layer of RPO that covers these devices, the layer of RPO can be removed from the devices which need to be provided with salicide points of electrical contact, thus exposing the surfaces that need to be salicided and enabling the completion of the salicidation for the devices that are not covered by a layer of Resistance Protective Oxide.

With the continuing decrease in device feature size, the thickness of the layer of RPO is also further reduced, which places increased demands on the quality of the layer of RPO that is deposited. The quality of the layer of RPO is typically evaluated using parameters such as Field-to-Breakdown ($V_{bd}$) and Charge-to-Breakdown ($Q_{bd}$). One of the problems that is encountered in the era of sub-micron device feature size is the occurrence of voids in the interface between the layer of RPO and the layer of polysilicon that is used for the creation of the gate structure. It is critical that the occurrence of such voids is prevented, the invention provides such a method by controlling the quality of the layer of RPO that is used.

U.S. Pat. No. 6,348,389 B1 (Chou et al.) shows a method for forming and etching a RPO layer.

U.S. Pat. No. 6,319,784 B1 (Yu et al.) shows a salicide process with an RPO layer comprising a dielectric material such as oxide, nitride or SiON.

U.S. Pat. No. 6,015,730 (Wang et al.) reveals an RPO layer process.

U.S. Pat. No. 6,037,222 (Huang et al.) shows a RPO layer.

SUMMARY OF THE INVENTION

A principle objective of the invention is to provide a method for the creation of a RPO layer that avoids the creation of voids between the layer of RPO and an underlying layer of polysilicon.

Another objective of the invention is to provide a method for the creation of a RPO layer that does not lead to the presence of metal residue in voids between the layer of RPO and an underlying layer of polysilicon.

Yet another objective of the invention is to provide a method for the creation of an RPO layer of adequate thickness so that the created layer of RPO provides protection to non-salicided surfaces.

A still further objective of the invention is to provide a method for the creation of a RPO layer that takes advantage of a good wet stop of each layer and that provides an improved and wider RPO etch processing window.

A still further objective of the invention is to provide a method for the creation of a RPO layer that uses full wet etch processing only.

In accordance with the objectives of the invention a new method is provided for the creation of a layer of a Resistance Protective Oxide (RPO). A layer of ONO is deposited that is to function as the layer of RPO. The deposited layer of ONO is patterned and wet etched, removing the upper or first layer of silicon dioxide. The patterned upper or first layer of silicon dioxide is used as a hardmask to remove the central layer of silicon nitride applying a wet etch. A wet etch is then applied to remove the remaining lower or second layer of silicon dioxide, completing the patterning of the layer of RPO.

BRIEF DESCRIPTION OF THE DRAWINGS

FIG. 1 shows the cross section of a substrate over the surface of which a layer of ONO has been deposited.

FIG. 2 shows the cross section of the substrate after a mask of photoresist has been formed over the surface of the layer of ONO.

FIG. 3 shows the cross section of the substrate after the upper layer of oxide has been etched in accordance with the photoresist mask, creating a pattern in the upper layer of oxide.

FIG. 4 shows the cross section of the substrate after the photoresist mask has been removed from the surface of the upper layer of oxide.

FIG. 5 shows the cross section of the substrate after the (central) layer of nitride has been etched, using the pattern created in the upper layer of oxide as a mask.

FIG. 6 shows the cross section of the substrate after the lower layer of oxide has been etched using the pattern created in the upper of oxide and the central layer of nitride as a mask.

DESCRIPTION OF THE PREFERRED EMBODIMENTS

The invention makes use of the selective wet etch characteristics of silicon dioxide and silicon nitride during the application of an oxide wet etch using $H_3PO_4$ as the etchant gas. In addition, a layer of ONO provides excellent wet etch stop capabilities for purposes of creating a RPO layer.

It is well known in the art that in a layer of oxide-nitride-oxide (ONO), the first layer of oxide is native oxide. The second layer comprising nitride is conventionally grown in a low power furnace at a temperature within the range of 600 to 700 degrees C. to a thickness within the range of between 40 and 60 Angstrom, the final oxidation layer is grown in a low power furnace at a temperature within the range between 750 and 800 degrees C. for a time period within the range between 30 and 60 minutes.

Conventional methods of creating an RPO layer use pure silicon dioxide that is defined by applying an oxide wet etch that removes the silicon dioxide over the surface area where the salicided layers have to be formed. However, if a thicker layer of RPO is required, a longer oxide wet etch must be applied, resulting in lateral wet oxide etch and the creation of voids between the remaining layer of RPO and underlying layers of polysilicon of the CMOS gate electrode structure. These voids are exposed and as a consequence collect metal residue during the process of salicidation, leading to potential electrical shorts between the gate electrode and adjacent device elements such as gate spacers or source/drain region contact plugs. By creating a thinner layer of RPO, this thinner layer of RPO provides poor protection and does not provide adequate assurance that there will be a required separation between salicided and non-salicided surfaces. One of the methods that have been applied to avoid these problems is using a combination of wet and dry etching steps. The etch stop of a dry etch however is typically difficult to define while the plasma that is used during a dry etch process has a negative affect on device lifetime and reliability performance.

The detailed processing flow of the invention is now described in detail using FIGS. 1 through 6 for this purpose.

Figure 1:
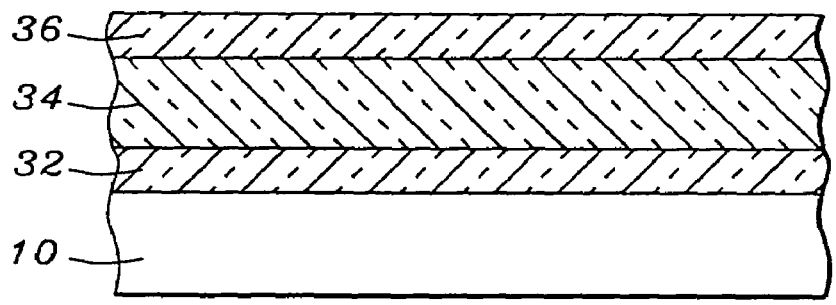
FIGS. 1 through 6 are used to describe the invention, shown in these figures are.

Referring first specifically to FIG. 1, there is shown a cross section of a semiconductor substrate 10 over the surface of which has been created a layer of ONO by the successive creation of:

1. A first or lower layer 32 of RPO oxide, created preferably to a thickness of about 80 Angstrom
2. A central layer 34 of RPO silicon oxynitride (SiON), created preferably to a thickness of about 250 Angstrom, and
3. A second or upper layer 36 of RPO oxide, created preferably to a thickness of about 80 Angstrom.

A layer of RPO can be deposited using methods of LPCVD or CVD or PECVD, a layer of RPO is preferably created using methods of PECVD in view of the lower processing temperatures that are required for the PECVD process. Other deposition means may alternatively be used to deposit this layer. PECVD silicon oxide, for layers 32 and 36, may be deposited at temperatures between 200 and 350 degrees C. using $SiH_4/O_2$ or $SiH_4/N_2O$ as precursors.

A photoresist mask 38 is now created over the surface of the layer of ONO, the opening 37 provides a pattern for the removal of the layer of ONO from above the surface of the substrate 10. Conventional methods of photolithographic exposure and development are used for the creation of photoresist mask 38 shown in cross section in FIG. 2.

Figure 3:
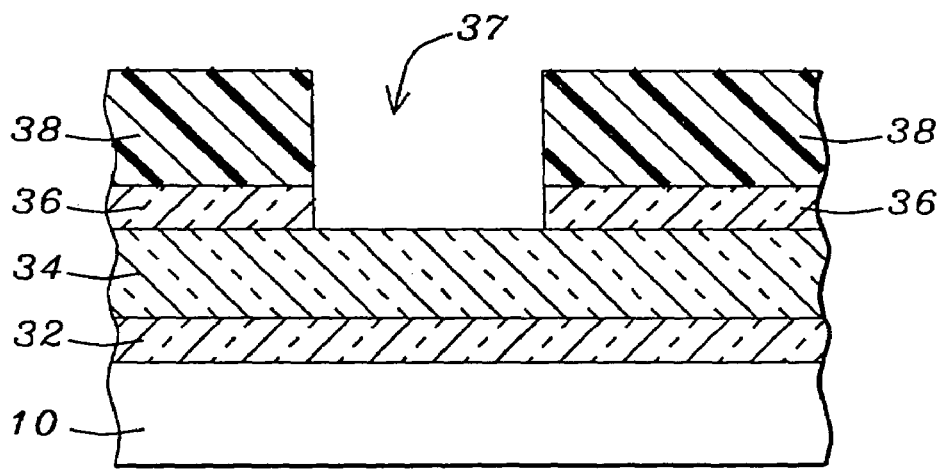
Figure 4:
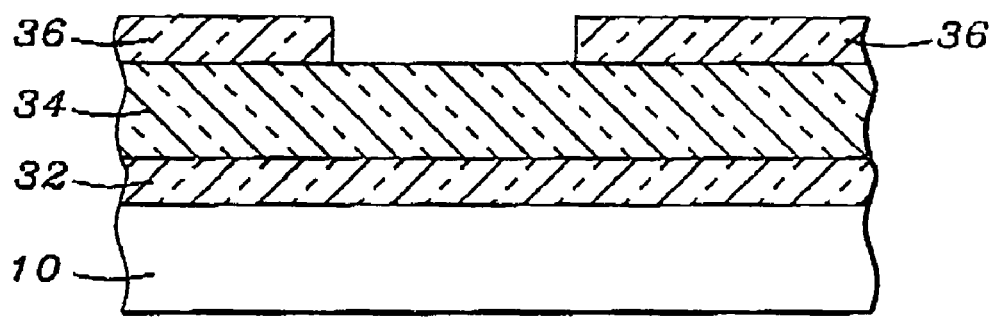

With the photoresist mask 38 in place, the layer 36 of RPO oxide is now wet etched and removed in accordance with the photo resist mask as shown in the cross section of FIG. 3. Layer 36 of silicon oxide can be etched by RIE or anisotropic plasma etching to form a hardmask by using an etchant containing fluorocarbons, for example $CF_4$ or $CHF_3$. More specifically, layer 36 of silicon oxide can be removed by applying isotropic plasma etching in an etchant comprising fluorocarbons, performed in a parallel HDP reactor in-situ, in a plasma containing $CF_4$ at a flow rate of between about 30 and 60 sccm, in an argon carrier gas at a flow rate sufficient to maintain a pressure between about 5 and 15 mTorr in said HDP reactor and at an rf power of between about 400 and 1,200 Watts TCP with between about 1,000 and 1,500 Watts bias. Layer 36 of silicon oxide can also be etched by RIE or anisotropic plasma etching by using an etchant containing fluorocarbons, for example CF4 or CHF3. The photoresist mask is then removed from the surface of layer 36, as shown in cross section in FIG. 4, applying conventional methods of ashing followed by a thorough surface clean.

Figure 5:
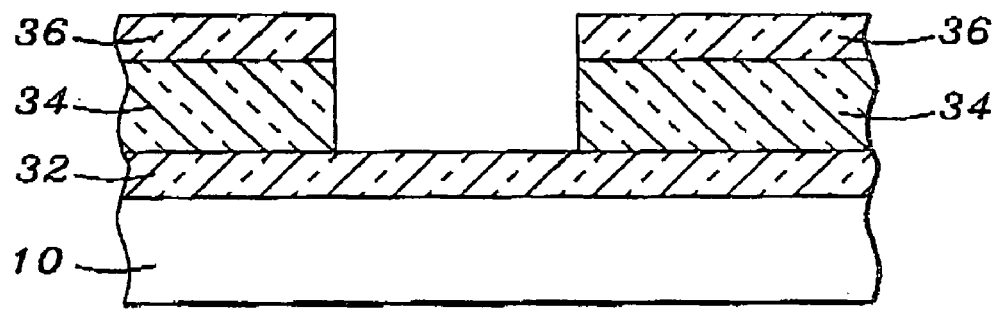

Using the patterned and etched layer 36 of RPO silicon oxide as a hardmask, the layer 34 of RPO silicon nitride can now be etched. Nitride layers can be removed by dipping the structure into hot phosphoric acid ($H_3PO_4$), which is a standard wet nitride removal process. This leads to the cross section that is shown in FIG. 5.

Figure 6:
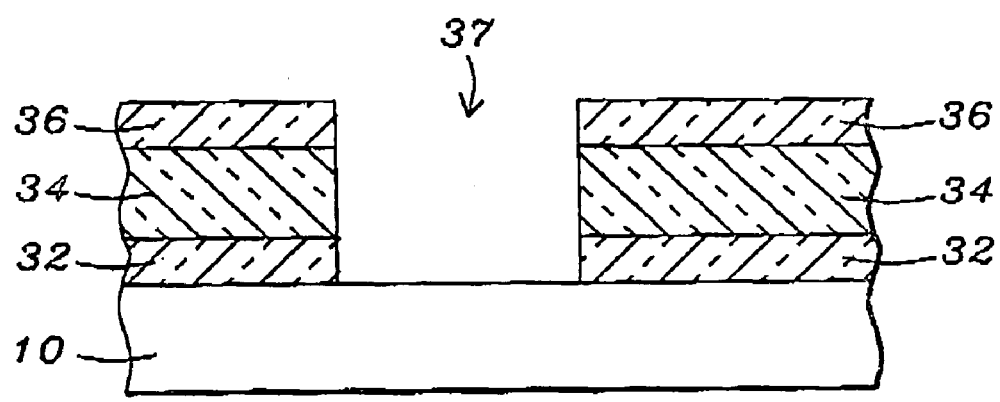

As a final step, the results of which are shown in the cross section of FIG. 6, a second silicon oxide etch is applied, removing the RPO oxide layer 32 in accordance with the mask formed by patterned and etched layers 34 and 36, again applying a wet etch using an etchant containing fluorocarbons, for example $CF_4$ or $CHF_3$.

Since a thin layer 32 of silicon dioxide has been created as a first layer of the composite ONO layer, the wet etch, applied for the removal of layer 32 in accordance with the thereover created etch mask comprising the patterned and etched layer 34 and 36, can be of short duration. Due to the short duration of the applied wet etch for layer 32, lateral etch effects are greatly reduced, thereby reducing the occurrence of voids between the layer of ONO and underlying layers of polysilicon.

For surface regions over the surface of the substrate where the process of salicidation must be applied, the layer of ONO that remains in place is adequately thick to provide the required protection to these surface regions. The invention therefore provides a method that allows for:

the creation of a patterned and etched layer of RPO
avoiding conventional problems of lateral etch during etching of the layer of RPO, thereby avoiding problems of creation of voids between the layer of RPO and underlying layers of polysilicon of CMOS gate electrodes, and the layer of RPO remaining in place over surface areas that are to be protected during salicidation processing is adequately thick for purposes of surface protection.

The cross section that is shown in FIG. 6 shows the final RPO pattern. The surface of substrate 10 that is covered by the ONO layers 32/34/36 is the surface area that comprises CMOS devices to the contact surfaces of which no salicidation is to be provided. The exposed surface of substrate 10, bounded by opening 37, is the surface area that comprises CMOS devices to the contact surfaces of which salicidation is to be provided.

Figure 7:
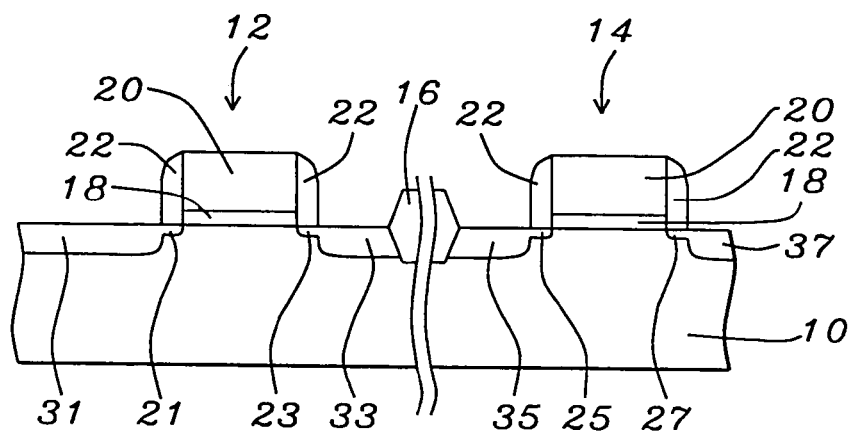
FIG. 7 shows a cross section of the surface of a substrate over which two gate structures have been created, the two gate structures are divided into separate groups.
Figure 8:
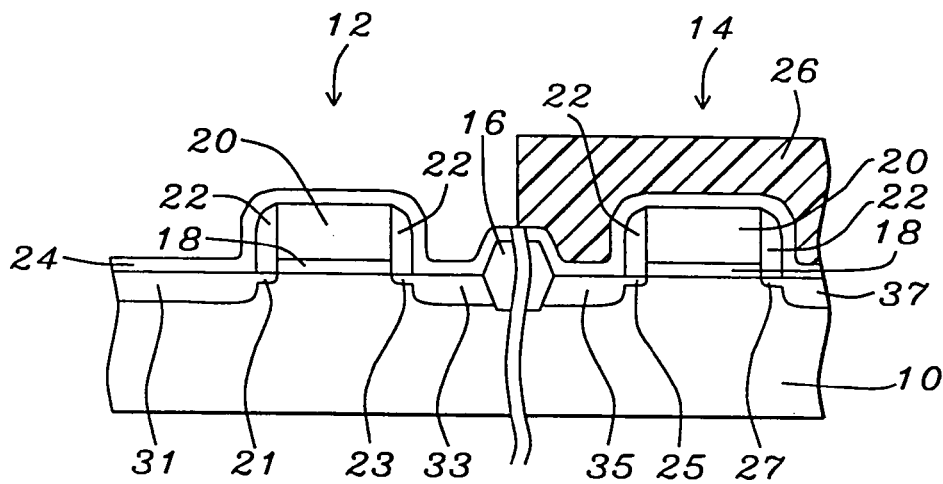
FIG. 8 shows a cross section of the two gate structures of FIG. 7 after a layer of RPO has been deposited over the two gate structures, the two gate structures have been patterned for separate processing using a photoresist mask.
Figure 9:
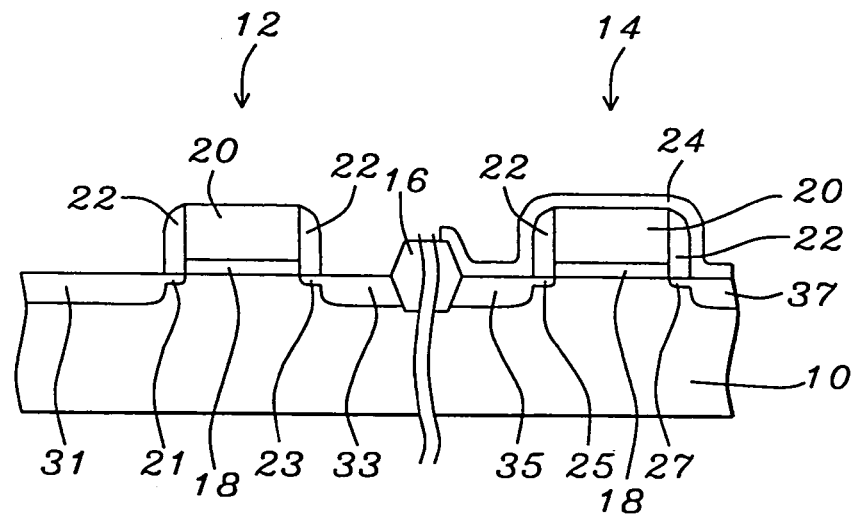
FIG. 9 shows a cross section of the two gate structure after the layer of RPO has been etched in accordance with the photoresist mask, the photoresist mask has then been removed from the surface of the layer of RPO.

This is further highlighted with the cross sections that are shown in FIGS. 7 through 9. In the cross section that is shown in FIG. 7, there are highlighted the following elements of the structures:

10, the surface of a semiconductor substrate 12 and 14, two gate electrodes that have been created over the surface of substrate 10

16, a region of insulation, such as a region of Field Oxide or a Shallow Trench Isolation region, that has been created between the two gate structures 12 and 14 in order to electrically isolate gate structures 12 and 14 from each other 18, a layer of gate oxide that has been created over the surface of substrate 10, deposited using methods of LPCVD or CVD or PECVD or by exposing the surface of substrate 10 to an oxidizing environment; layer 18 of gate oxide is preferably created to a thickness between about 300 and 500 Angstrom and more preferably to a thickness of about 400 Angstrom 20, the gate electrode of gate structures 12 and 14, gate electrode 20 preferably comprises polysilicon and is, after blanket deposition over the surface of a layer 18 of gate oxide, etched together with layer 18 of gate oxide to form the gate structures that are shown in cross section in FIG. 7

22, gate spacers that are formed over the sidewalls of the gate structures 18/20

21, 23 LDD impurity implantations into the surface of substrate 10, self-aligned with gate electrode 12

25, 27 LDD impurity implantations into the surface of substrate 10, self-aligned with gate electrode 14

31, 33 source/drain impurity implantations into the surface of substrate 10, self-aligned with gate electrode 12, and 35, 37 source/drain impurity implantations into the surface of substrate 10, self-aligned with gate electrode 14.

FIG. 8 shows a cross section of the two gate electrodes 12 and 14 that have been shown in FIG. 7, added to the cross section that is shown in FIG. 8 are:

24, a layer of RPO, deposited over the surface of the gate electrodes 12 and 14 and the exposed surface of substrate 10 as a means to protect these surfaces during subsequent processing, and 26, a patterned and developed layer of photoresist, forming a photoresist mask 26 over the surface of layer 24 of RTO. A layer of photoresist can be etched, for the formation of photoresist mask 26, by applying $O_2$ plasma and then wet stripping by using a $H_2SO_4$, $H_2O_2$ and $NH_4OH$ solution.

The patterned and developed layer 26 of photoresist has been shown in the cross section of FIG. 8 in order to highlight processing requirements such as requirements of salicidation. For instance, the layer 26 can be used to etch layer 24 of RPO, exposing regions of contact of gate structure 12 after which these contact regions of gate structure 12 can be salicided. Also, the layer 26 of photoresist protects gate structure 14. If therefore gate structure 12 is provided with impurity implantations, self-aligned with gate structure 12, for the creation of LDD regions and source/drain regions for gate structure 12, then the RPO layer 24 overlying the gate structure 14 is not exposed to the impurity implantation, thus avoiding damage to layer 24 of RPO where this layer overlies gate structure 14.

Figure 2:
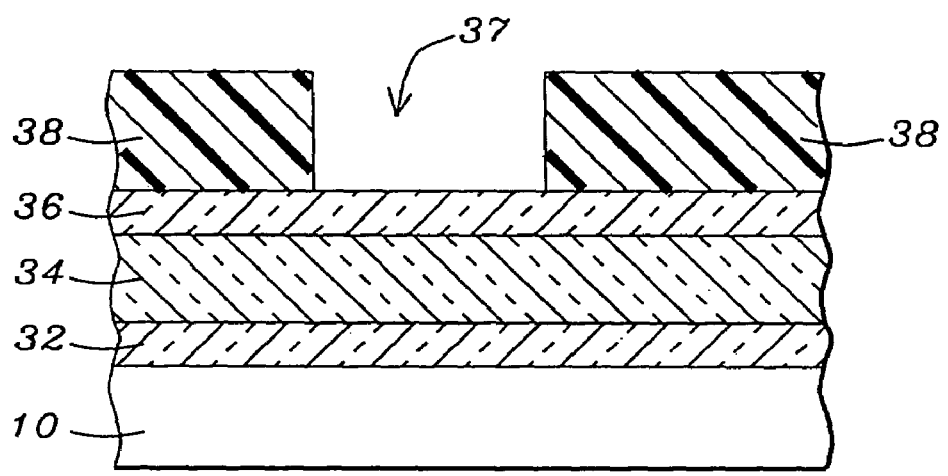

The structure that is shown in cross section in FIG. 8 is now, from a processing point of view, in the same state as the structure that has been shown in cross section in FIG. 2. Layer 24 of ONO can therefore further be wet etched following the same sequence of steps as have been highlighted above under FIGS. 2 through 6.

It must thereby be remembered that layer 24, shown in the cross section of FIG. 8, is a composite layer of a lower or first layer of silicon dioxide over which a layer of silicon nitride over which is an upper or second layer of silicon dioxide have been deposited. These layers (of silicon dioxide/silicon nitride/silicon dioxide) have not been highlighted as separate layers in the cross sections of FIGS. 8 and 9 for reasons of simplicity of presentation. To differentiate between these layers in dependency of presence or absence thereover of the photoresist mask 26, these layers can be referred to as unmasked and masked layers.

This latter can be more clearly defined as follows:

Underneath photoresist mask 26 and forming part of layer 24 is a first layer of masked silicon dioxide over which a layer of masked silicon nitride is deposited over which a second layer of masked silicon dioxide is deposited.

The exposed part of layer 24 comprises a first layer of unmasked silicon dioxide over which a layer of unmasked silicon nitride is deposited over which a second layer of unmasked silicon dioxide is deposited.

These steps of wet etch therefore as these steps apply to the cross section of FIG. 8 are as follows:

1. first wet silicon dioxide etch of the second unmasked silicon dioxide layer of layer 24 using the photoresist mask 26 as a mask, this removes the second unmasked layer of silicon dioxide of layer 24

2. removing the photoresist mask 26

3. wet etching the unmasked layer of silicon nitride of layer 24, using the masked second layer of silicon dioxide as a first wet etch mask, creating a second mask comprising a layer of masked silicon nitride over which a second layer of masked silicon dioxide, exposing the surface of the first unmasked layer of silicon dioxide 4. second wet silicon dioxide etch of the first unmasked silicon dioxide layer of layer 24 using the second mask as a mask, this removes the first unmasked layer of silicon dioxide of layer 24. Having completed the processing steps of the invention, the structure that is shown in cross section in FIG. 9 has been obtained. From this cross section it is clear that contact surfaces of CMOS device 12 can now be salicided while contact surfaces of CMOS device 14 are shielded from salicidation.

The invention therefore provides, for the cross section that is shown in FIG. 9 a method that allows for:

a patterned and etched layer 24 of RPO.

conventional problems of lateral etch during etching of the layer 24 of RPO have been avoided, thereby avoiding problems of creation of voids between the layer 24 of RPO and underlying layers 20 of polysilicon of CMOS gate electrode 14, and the layer 24 of RPO remaining in place over surface areas of gate electrode 14 that are to be protected during salicidation processing is adequately thick for purposes of surface protection.

Additional problems that are solved by the invention, by preventing lateral etching of the RPO layer and by providing a remaining patterned and etched layer of RPO of adequate thickness, are the following:

1. the relatively thick remaining layer of RPO/ONO provides adequate protection to the shielded CMOS devices, over the surface of which the patterned and etched layer of RPO/ONO remains in place, such that no encroachment of formed salicided layers, such as layers of CoSix, occurs into the shielded CMOS devices; this protection becomes more urgent as device dimensions further decrease and as, as a consequence thereof, the distance between adjacent CMOS devices is further reduced; the indicated encroachment is caused by recesses being created, due to lateral etching, into layers of silicon oxide, such as the layer of gate oxide, underlying the gate electrode 2. for applications where the remaining layer of RPO is not thick enough, impurity implantations into the surface of the substrate, provided for CMOS devices over which no layer of RPO remains in place, affect the profile of the created salicided layer over the surface of the gate electrode, for application where impurity implantations are performed after salicidation has been completed, thereby having a negative affect on the series resistance of the gate electrode; this salicided layer over the surface of a gate electrode must, for reasons of series resistance performance, have a square profile; the indicated effect results in an undesirable peaked or sharp profile, and 3. junction leakage may occur between created regions of salicided material, such as CoSix, and surrounding regions of field isolation, such as regions of Shallow Trench Isolation (STI), caused by the created salicided layer penetrating along sidewalls of the regions of STI, due to inadequate protection provided by a relatively thin layer of RPO.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

The invention claimed is:

1. A method comprising:

providing a semiconductor substrate, providing a layer of resist protective oxide (RPO) on a surface of the substrate, the layer of RPQ comprising a first layer of silicon dioxide, a layer of silicon nitride, and a second layer of silicon dioxide;

patterning the layer of RPO wherein a region over the substrate containing at least one CMOS device is not covered by the layer of RPO, said step of patterning the layer of RFO comprises:

(i) patterning the first layer of silicon dioxide including using a photoresist layer;

(ii) removing the photoresist layer and subsequently patterning the layer of silicon nitride using the first layer of silicon dioxideas a mask;

(iii) pattering the second layer of silicon dioxide using the first layer of silicon dioxide and the layer of silicon nitride as a mask by applying a wet-etch to the second layer of silicon dioxide; and saliciding contact surfaces of the at least one CMOS device.

2. The method of claim 1, wherein patterning the first layer of silicon dioxide comprises applying a wet etch to said first layer of silicon dioxide.

3. The method of claim 2, wherein patterning the layer of silicon nitride comprises applying a wet nitride removal process to said layer of silicon nitride.

4. The method of claim 1, wherein patterning the first layer of silicon dioxide comprises reactive ion etching (RIB) or anisotropic plasma etching.

5. The method of claim 1, wherein the first layer of silicon dioxide has a thickness of about 80 Angstroms.

6. The method of claim 5, wherein the layer of silicon nitride has a thickness of about 250 Angstroms.

7. The method of claim 6, wherein the second layer of silicon dioxide has a thickness of about 80 Angstroms.

8. A method comprising:

providing a substrate, creating a patterned layer of ONO over at least a portion of the substrate wherein a region over the substrate containing at least one CMOS device is not covered by the layer of ONO, the laye of ONO comprising: (i) a first layer of silicon dioxide; (ii) a layer of silicon nitride; and (iii) a second layer of silicon dioxide;

wherein the step of creating a patterned layer of ONO comprises:including using a photoresist layer (a) patterning the first layer of silicon dioxide including using a photoresist layer;

(b) removing the photoresist layer and subsequently patterning the layer of silicon nitride using the patterned first layer of silicon dioxide as a mask;

(c) patterning the second layer of silicon dioxide using the patterned first layer of silicon dioxide and the patterned layer of silicon nitride as a mask, and by applying a wet etch to the second layer of silicon dioxide; and saliciding contact surfaces of the at least one CMOS device.

9. The method of claim 8, wherein patterning the first layer of silicon dioxide comprises applying a wet etch to said first layer of silicon dioxide.

10. The method of claim 9, wherein patterning the layer of silicon nitride comprises applying a wet nitride removal process to said layer of silicon nitride.

11. The method of claim 8, wherein patterning the first layer of silicon dioxide comprises reactive ion etching (RIE) or anisotropic plasma etching.

12. The method of claim 8, wherein the first layer of silicon dioxide has a thickness of about 80 Angstroms.

13. The method of claim 12, wherein the layer of silicon nitride has a thickness of about 250 Angstroms.

14. The method of claim 13, wherein the second layer of silicon dioxide has a thickness of about 80 Angstroms.

15. A method comprising:
providing a substrate having first and second regions;
creating a patterned layer of RPO over the first region, wherein the second region contains at least one CMOS device and is not covered by the layer of RPO, the layer of RPO comprising first and second layers of silicon dioxide and a layer of silicon nitride formed therebetween;
wherein creating the patterned layer comprises:
(a) patterning the first layer of silicon dioxide including using a photoresist layer;
(b) removing the photoresist layer and subsequently patterning the layer of silicon nitride using the patterned first layer of silicon dioxide as a mask;
(c) patterning the second layer of silicon dioxide using the patterned first layer of silicon dioxide and the patterned layer of silicon nitride as a mask, and applying a wet etch to the second layer of silicon dioxide; and
saliciding contact surfaces of the at least one CMOS device.

16. The method of claim 15, wherein patterning the first layer of silicon dioxide comprises applying a wet etch to said first layer of silicon dioxide.

17. The method of claim 16, wherein patterning the layer of silicon nitride comprises applying a wet nitride removal process to said layer of silicon nitride.

18. The method of claim 15, wherein patterning the first layer of silicon dioxide comprises reactive ion etching (RIE) or anisotropic plasma etching.

19. The method of claim 15, wherein the first layer of silicon dioxide has a thickness of about 80 Angstroms.

20. The method of claim 19, wherein the layer of silicon nitride has a thickness of about 250 Angstroms.

21. The method of claim 19, wherein the second layer of silicon dioxide has a thickness of about 80 Angstroms.

* * * * *

UNITED STATES PATENT AND TRADEMARK OFFICE
CERTIFICATE OF CORRECTION

| | |
|---|---|
| PATENT NO. | : 7,183,150 B2 |
| APPLICATION NO. | : 10/946406 |
| DATED | : February 27, 2007 |
| INVENTOR(S) | : Ming-Chang Hsieh et al. |

It is certified that error appears in the above-identified patent and that said Letters Patent is hereby corrected as shown below:

Column 7, line 61, delete "RPQ" and insert therefore -- RPO --.

Column 7, line 67, delete "RFO" and insert therefore -- RPO --.

Column 8, line 5, delete "dioxideas" and insert therefore -- dioxide as --.

Column 8, line 19, delete "(RIB)" and insert therefore -- (RIE) --.

Column 8, line 32, delete "laye" and insert therefore -- layer --.

Column 9, line 5, delete "RPO." and insert therefore -- RPO, --.

Column 10, line 14, delete "19" and insert therefore -- 20 --.

Signed and Sealed this

Twenty-fourth Day of July, 2007

JON W. DUDAS
*Director of the United States Patent and Trademark Office*